(12) United States Patent
McEuen (10) Patent No.: US 6,236,569 B1
(45) Date of Patent: May 22, 2001

(54) ATTACHING HEAT SINKS TO INTEGRATED CIRCUITS

(75) Inventor: Shawn S. McEuen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/583,825

(22) Filed: May 31, 2000

(51) Int. Cl.$^7$ .......................................................... H05K 7/20
(52) U.S. Cl. ........................... 361/719; 361/704; 361/687; 361/695; 165/104.33; 165/121; 257/717; 174/16.3
(58) Field of Search ...................... 361/700–707, 361/717–719, 690, 687, 692, 695; 165/80.2, 80.3, 185, 104.33, 299, 121, 122; 62/3.2, 259.2; 454/184; 257/718, 719, 722, 706, 707, 713, 717, 796; 174/16.3; 439/71, 73, 331, 525, 526, 330, 337, 68–70

(56) References Cited

U.S. PATENT DOCUMENTS

| | | | |
|---|---|---|---|
| 5,397,919 | * | 3/1995 | Tata et al. ............................. 257/717 |
| 5,430,610 | * | 7/1995 | Hung .................................... 361/697 |
| 5,676,199 | * | 10/1997 | Lee ...................................... 165/80.3 |
| 5,708,564 | * | 1/1998 | Lin ...................................... 361/704 |
| 5,807,104 | * | 9/1998 | Ikeya et al. ............................. 439/73 |
| 5,917,703 | * | 6/1999 | Murphy ................................ 361/704 |
| 5,945,736 | * | 8/1999 | Rife et al. .............................. 257/719 |
| 6,021,045 | * | 2/2000 | Johnson ................................ 361/704 |
| 6,086,387 | * | 7/2000 | Gallagher et al. ...................... 439/71 |

FOREIGN PATENT DOCUMENTS

409245918 * 9/1997 (JP) ............................... H01R/33/76

OTHER PUBLICATIONS

"ChipCoolers™ Heatsink and Mounting Clip", ChipCoolers, Inc.—The World Leader in Quality Thermal Solutions.

* cited by examiner

Primary Examiner—Leo P. Picard
Assistant Examiner—Michael Datskovsky
(74) Attorney, Agent, or Firm—Trop, Pruner & Hu, P.C.

(57) ABSTRACT

A heat transfer device may be secured to an integrated circuit without the use of tools in some embodiments. After placing the integrated circuit in a socketed holder, the heat transfer device mount may be pivoted atop the integrated circuit. A heat transfer device may be attached to the mount. The mount may abut a holder that receives the integrated circuit. The mount may be latched to the holder by undergoing a series of simple mechanical displacements.

30 Claims, 6 Drawing Sheets

ATTACHING HEAT SINKS TO INTEGRATED CIRCUITS

BACKGROUND

This invention relates generally to heat sinks for integrated circuits.

Because of the heat generated by some integrated circuits, an integrated circuit may be intimately associated with a heat transfer device that removes heat from an integrated circuit die. An integrated circuit die may be packaged and the package may be coupled to a heat transfer device. Alternatively, the die may be exposed for direct contact by the heat transfer device. A heat transfer device, such as a heat sink, has a high heat transfer coefficient.

Processors may become excessively hot during operation. This heat may ultimately result in damage to the processor and may adversely affect the speed of its operation. Thus, it is desirable to contact the processor with a heat transfer device that removes heat.

Heat transfer devices may be active or passive. An active heat transfer device normally includes a fan which forces air over the integrated circuit to increase its rate of heat transfer. A passive heat transfer device is generally a heat sink with desirable heat transfer characteristics. Combinations of active and passive heat transfer devices are commonly utilized.

Attaching the heat transfer device over an integrated circuit on a circuit board can become a relatively complex operation. Generally, it is desirable to enable the removal of the integrated circuit device from the heat transfer device. This facilitates assembly and repair of the heat transfer device and testing of the integrated circuit.

In many cases, the heat transfer device is relatively bulky. It is generally desirable to contact the integrated circuit device with the heat transfer device. Commonly, an integrated circuit electrically couples to a variety of contacts on a circuit board, for example using pins that engage slots in a socket or other carrier. Thus, the integrated circuit may be attached to the circuit board and the heat transfer device may be attached over the integrated circuit in a removable, electrically contacting engagement. Therefore, the connection of the integrated circuit to the circuit board and the association of the heat transfer device with the integrated circuit may become complex.

For example, in connection with some designs, the attachment of the various components may require the use of tools. The use of tools generally results in longer assembly time. The assembler must assemble components and then grab a tool to secure the components together.

It would be desirable to enable the connection of the heat transfer device to the integrated circuit holder without requiring the use of any tools. Moreover, it would be desirable to have a way to readily and easily associate these components with one another.

DETAILED DESCRIPTION

Figure 1:
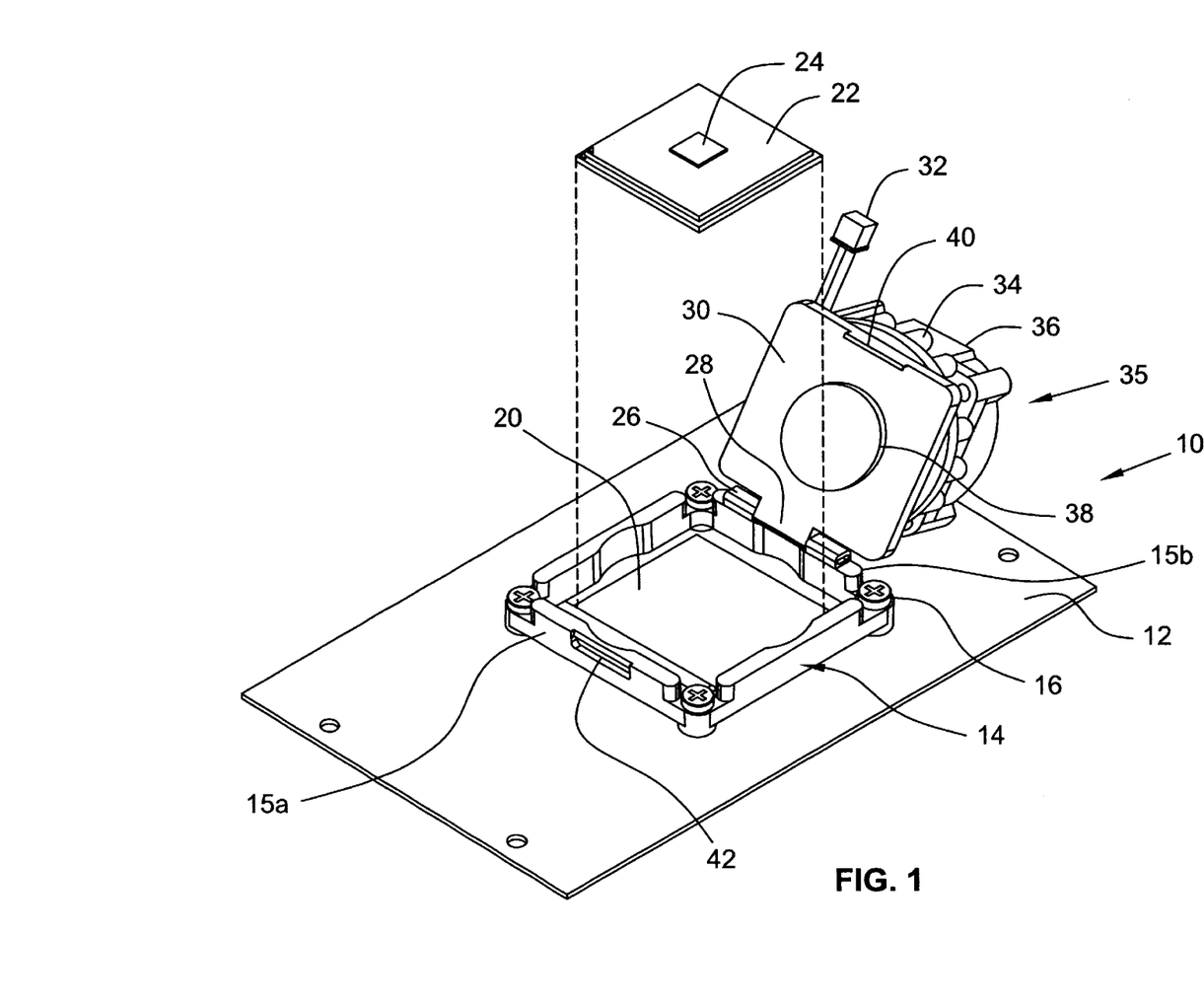
FIG. 1 is a perspective view of one embodiment of the present invention showing the placement of the integrated circuit.

Referring to FIG. 1, an electronic device 10 may include an integrated circuit 22 secured within a holder 14 in turn secured to a circuit board 12. A heat transfer device 35 may be secured to the holder 14 for pivotal movement around one of the edges of the holder 14. The holder 14, in one embodiment of the present invention, includes four sides 15 that define a frame around the integrated circuit 22. Each corner of the holder 14 may be secured by a threaded fastener 16 to the circuit board 12. In one embodiment of the present invention, the device 10 is a motherboard and the integrated circuit 22 is a processor.

In one embodiment of the present invention, the integrated circuit 22 includes an organic layer grid array (OLGA) package. However, other packaging techniques may be utilized. In the illustrated package, the integrated circuit die 24 is exposed. The integrated circuit 22 may be secured to a socket 20 within the frame 14. The socket 20 may be secured directly to the circuit board 12 in one embodiment of the present invention. The socket 20 may include contacts (not shown) which mate with contacts (not shown) on the integrated circuit 22. In one embodiment of the present invention, the socket 20 may include pins that engage slots in the integrated circuit 22. However, any type of integrated circuit connection technique may be utilized.

The heat transfer device 35 may include a threaded heat sink member 38, a heat sink mount 30, an active heat transfer device 36, an electrical connector 32 to supply power to the device 36, and a heat sink 34. In some embodiments, the active heat transfer device 36, which may include a fan 44, may not be included. While the heat sink 34 is shown as a pin type heat sink, any other heat sink design may be utilized including, for example, those that include fins.

Figure 2:
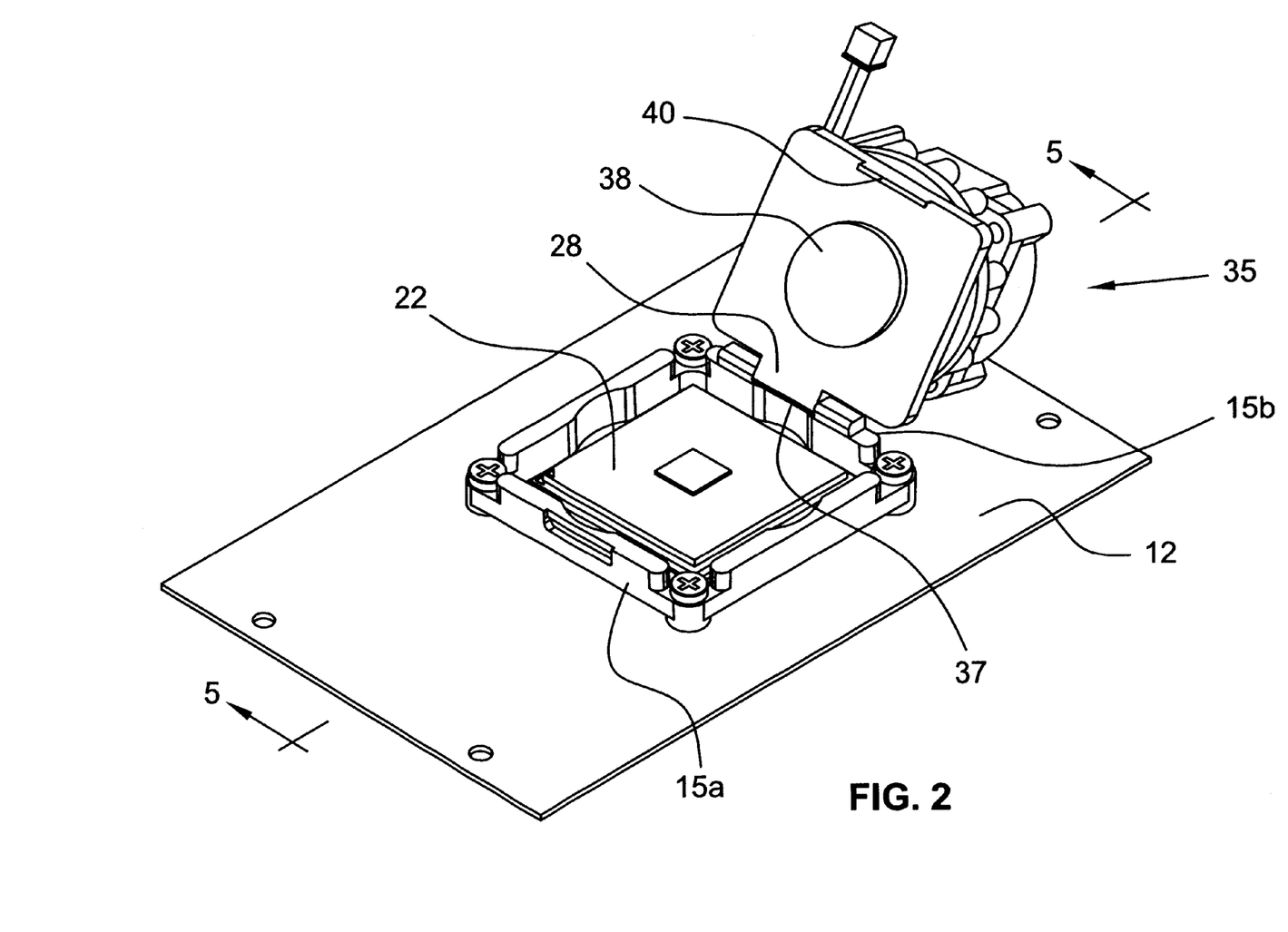
FIG. 2 is a perspective view of the embodiment of FIG. 1 after placement of the integrated circuit.

As shown in FIG. 2, the integrated circuit 22 may be placed on the socket 20 within the holder 14 with the die 24 facing upwardly. The heat transfer device 35 may rest in the overcenter position shown in FIG. 2. Interference between the holder 14 and the mount 30 may prevent further clockwise rotation from the position shown in FIG. 2.

Figure 3:
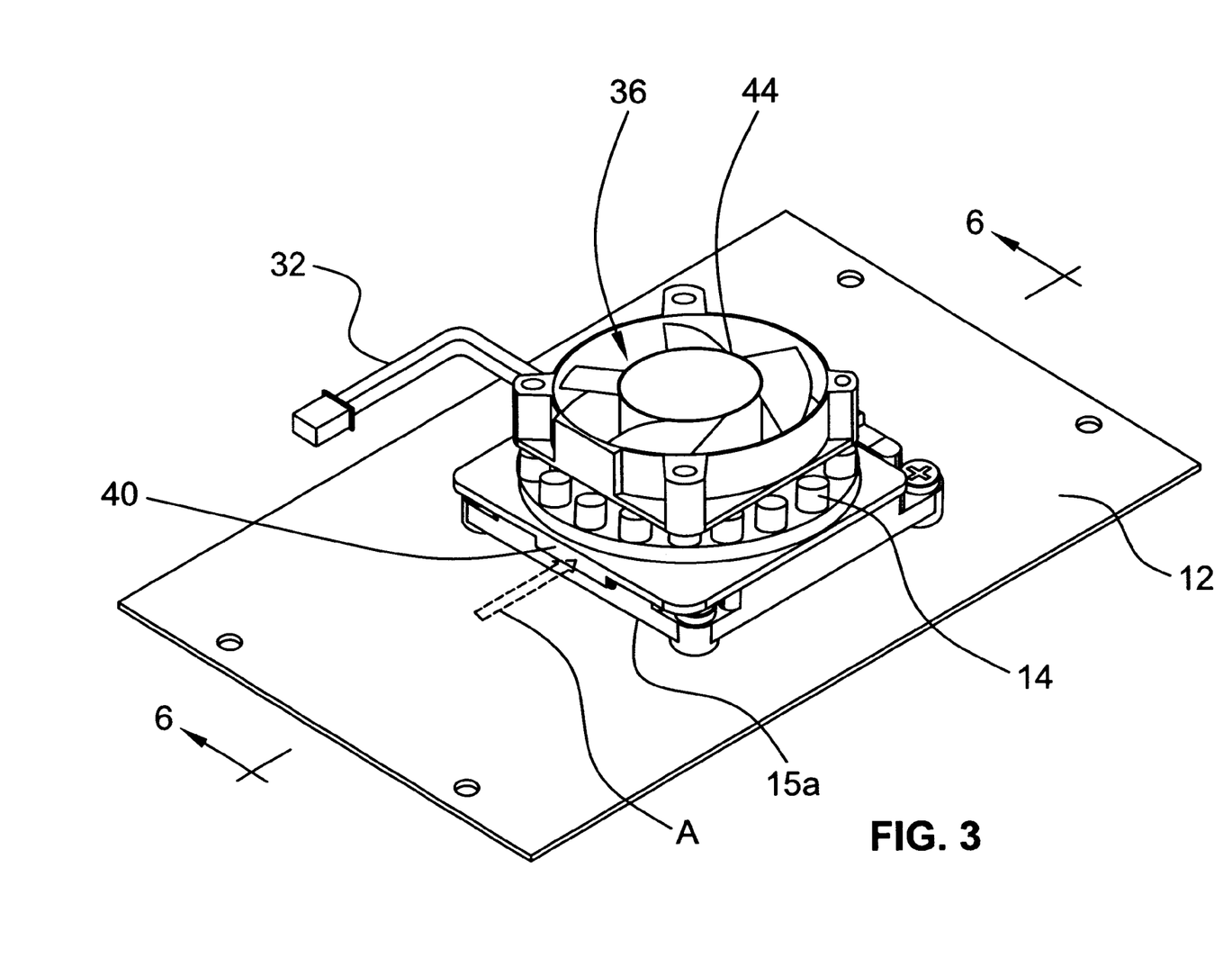
FIG. 3 is a perspective view of the embodiment shown in FIG. 1 after the heat transfer device has been pivoted over the integrated circuit.

Referring to FIG. 3, the heat transfer device 35 may pivot counterclockwise around the pivotal connection 37 so that the pivotally mounted heat sink mount 30 rests on top of the holder 14. The heat sink member 38 is then in direct contact with the die 24, in accordance with one embodiment of the present invention. However, other integrated circuits 22 may be utilized and it is not essential (although it may be advantageous) that the heat sink member 38 directly contact the die 24.

Figure 5:
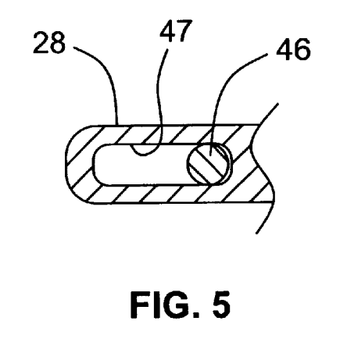
FIG. 5 is a partial, enlarged cross-sectional view taken generally along the line 5—5 of FIG. 2.

The pivotal connection 37 includes a slotted member 28, shown in FIG. 5, connected to, or integral with, the heat sink mount 30. An axle 46, associated with the holder 14, is journaled within an elliptical slot 47 inside the mount 30. Because the slot 47 is elongated, relative movement is possible between the member 28 and the axle 46. In other embodiments, the axle 46 may be included as part of the mount 30 and the member 28 may be a part of the holder 14. In any case, the arrangement of the axle 46, journaled within the member 28, allows pivotal motion of the heat transfer device 35 around the side 15b of the holder 14 (from the position shown in FIG. 2) until the device 35 contacts the holder 14 in face-to-face abutment, as shown in FIG. 3.

While a technique is described in which the mount 30, heat sink 34, and active heat transfer device 36 are pivoted as a unit, other techniques may also be used. For example, the mount 30 may be pivoted on its own, and other components may be thereafter secured to the mount 30.

The heat transfer device 35 assumes an "overbite" relationship with the holder 14, as shown in FIG. 3. Namely, a cantilevered latch 40 on one edge of the heat sink mount 30 extends over and beyond the side 43 of the holder 14 side 15a.

Figure 7:
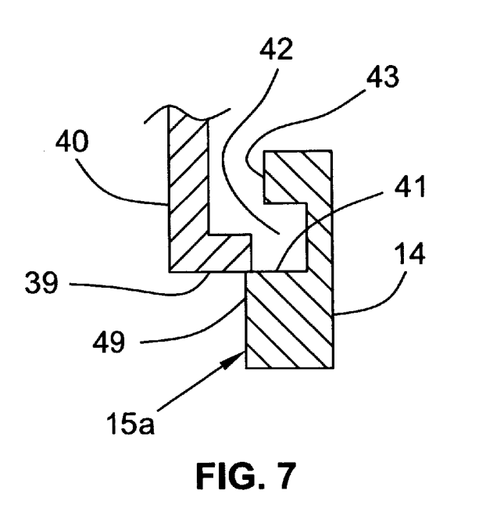
FIG. 7 is a partial, enlarged cross-sectional view taken generally along the line 6—6 in FIG. 3.

Referring to FIG. 7, the latch 40 is L-shaped and rests on a land 41 on a catch 42. The side 43 of the catch 42 is offset from the surface 49 of the catch 42, forming an effective land or stop 41. Because the latch 40 extends outwardly past the surface 43, the relationship between the heat transfer device 35 and the side 43 may be described as an overbite relationship. In addition, the engagement of the latch 40 horizontal portion 39 with the land 41 controls the extent of pivotal movement between the heat transfer device 35 and the holder 14. This further aligns the horizontal portion 39 with the catch 42 defined within the holder 14.

While an advantageous arrangement is shown in which the heat transfer device 35 pivots around a first side 15b of the holder 14 and latches on an opposed side 15a of the holder 14, other arrangements may be possible as well. For example, an intermediate latching mechanism may also be used.

Figure 6:
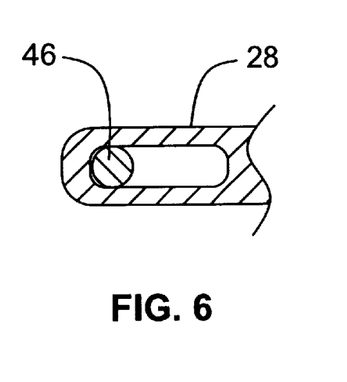
FIG. 6 is a partial, enlarged cross-sectional view corresponding to FIG. 5 but taken generally along the line 6—6 in FIG. 3.

Referring again to FIG. 3, the heat transfer device 35 may then be translated in the direction indicated by the arrow A relative to the holder 14. In the illustrated embodiment, the heat transfer device 35 is translated along a plane parallel to the circuit board 12. It is translated in a direction that causes the latch 40 to move towards the pivot axle 46 (FIG. 5) and the catch 42 (FIG. 7). As a result, the arrangement of the axle 46 relative to the member 28 changes from that shown in FIG. 5 to that shown in FIG. 6. That is, there is relative translating motion between the axle 46 within the slot 47 and the member 28.

Figure 8:
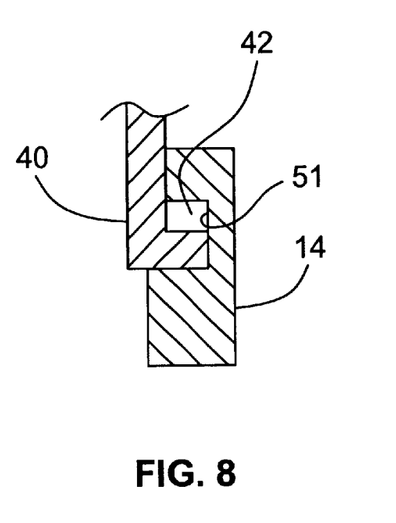
FIG. 8 is a partial, enlarged cross-sectional view corresponding to FIG. 7 but taken along the line 8—8 in FIG. 4.

At the same time, this translation causes the latch 40 and its horizontal portion 39 to fully engage the catch 42 and to abut against the rear surface 51 of the catch 42, as shown in FIG. 8. In this situation, the latch 40 may also abut against the surface 41 in one embodiment of the present invention. Thus, the latch 40 has now engaged the catch 42. However, the latch 40 is positioned at the bottom of the catch 42 relative to the heat transfer device 35.

Figure 4:
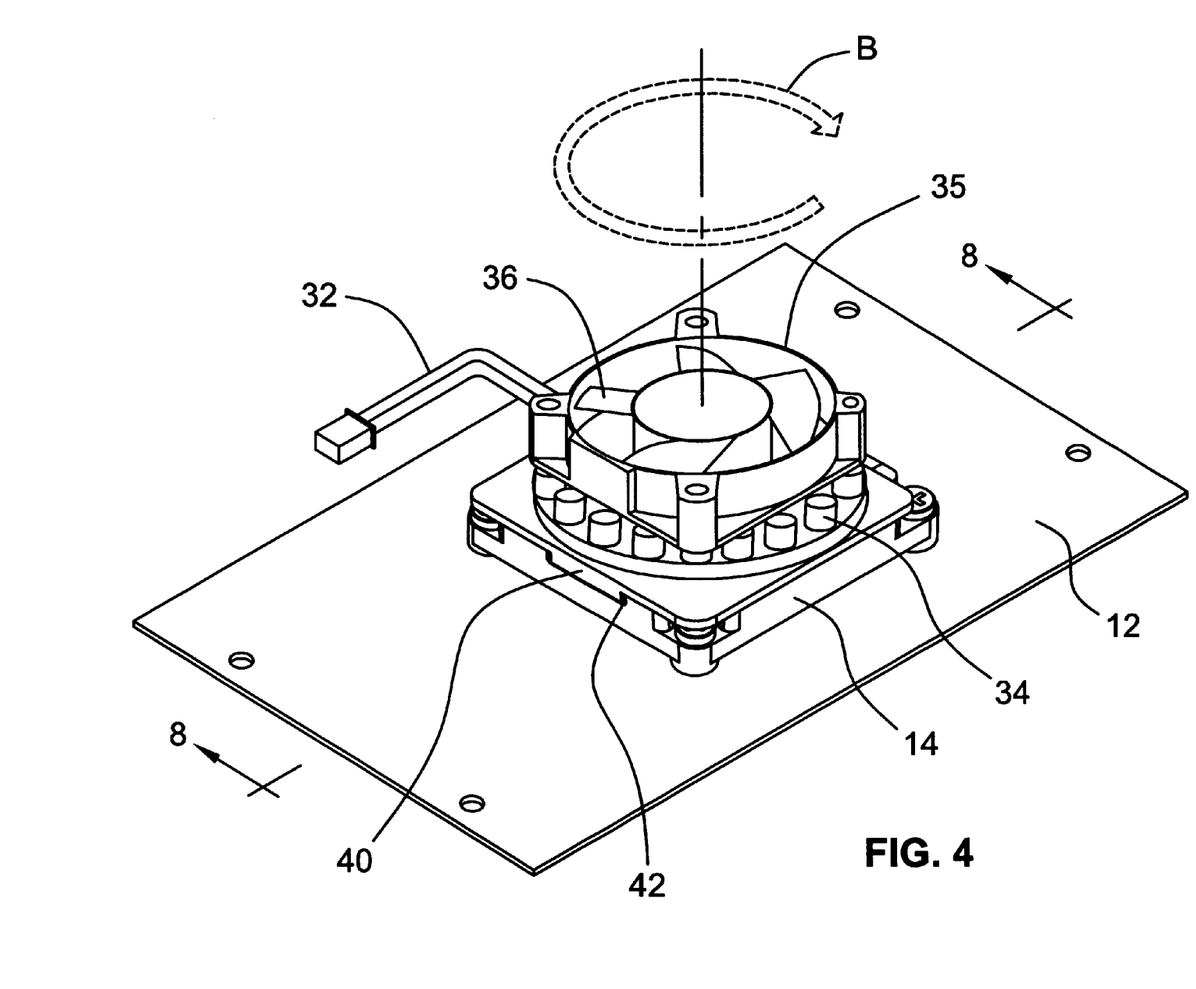
FIG. 4 is a perspective view of the embodiment of FIG. 3 showing the process of securing a heat transfer device to the integrated circuit.

Referring next to FIG. 4, the heat transfer device 35 may be rotated in the direction indicated by the arrows B in accordance with one embodiment of the present invention. This may be done by rotating the active heat transfer device 36 and/or the heat sink 34 relative to the heat sink mount 30. This rotation causes the heat sink member 38 to screw into the heat sink mount 30 and to extend further downwardly. The member 38 continues to thread downwardly, in response to the rotation indicated by the arrow B, until the heat sink member 38 comes into tight contact with the integrated circuit 22. Thus, the heat transfer device 35 may be threaded into the heat sink mount 30.

Figure 9:
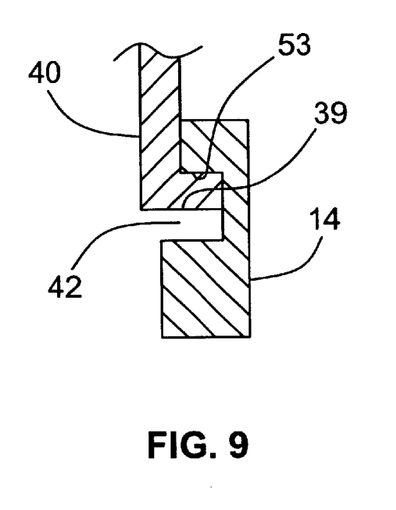
FIG. 9 is a partial enlarged cross-sectional view taken generally along the line 8—8 in FIG. 4 after rotation of the heat transfer device to secure the heat sink to the integrated circuit.

Upward motion of the heat transfer device 35 may be resisted by the engagement between the latch 40 and the catch 42. More particularly, as shown in FIG. 9, the latch 40 moves upwardly relative to the catch 42, in response to the rotation of heat transfer device 35, until the horizontal portion 39 engages the upper edge 53 of the catch 42 in the holder 14. In this position, the heat transfer device 35 is securely latched against motion relative to the holder 14. The force of the heat sink member 38 against the integrated circuit 22 and particularly the die 24 provides an upward force which secures the latch 40 to the holder 14 in one embodiment of the invention.

Figure 10:
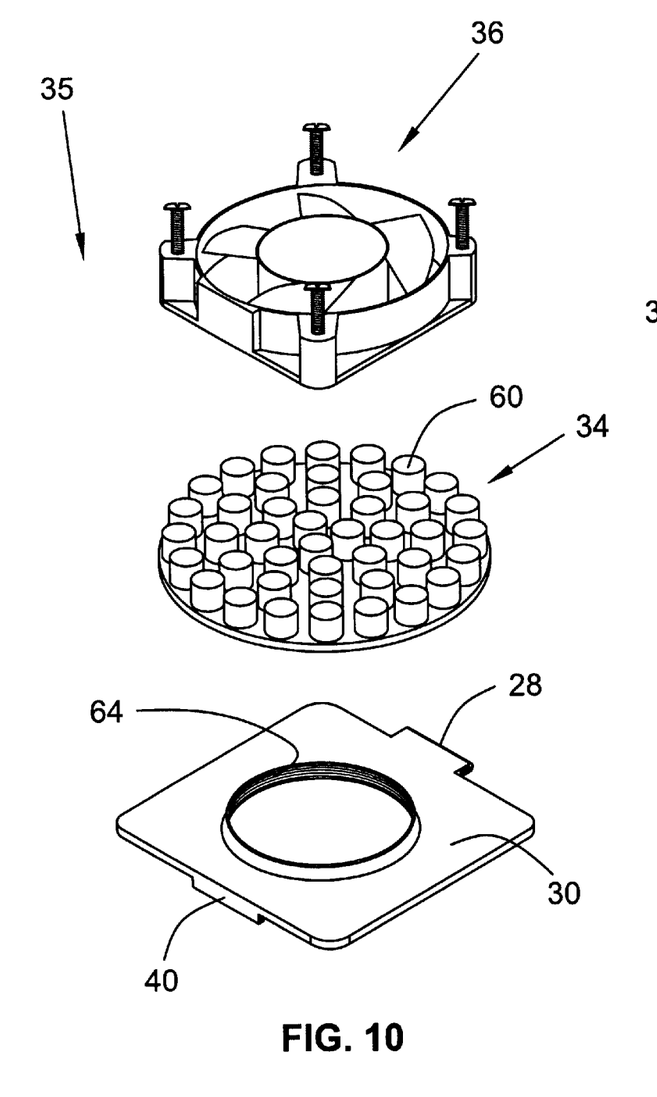
FIG. 10 is an exploded view of the heat transfer device in accordance with one embodiment of the present invention.

Referring to FIG. 10, the heat transfer device 35 includes the active heat transfer device 36, the heat sink 34 and the mount 30. In one embodiment of the present invention, the active heat transfer device 36 and the heat sink 34 may be secured by threaded fasteners which engage the interstices between the upstanding pins 60 of the heat sink 34.

Figure 11:
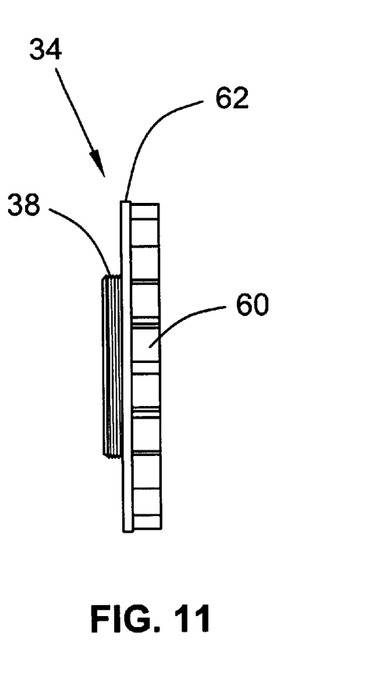
FIG. 11 is a side elevational view of the heat sink shown in FIG. 10.

The heat sink 34, shown in FIG. 11, includes a base plate 62 from which the pins 60 extend. In addition, the centrally located, downwardly depending threaded member 38 is connected to the plate 62. A wide variety of heat transfer devices may be used as the heat transfer device 35.

The member 38 threadedly engages a ring 64 centrally located within the mount 30. As a result, either or both of the active heat transfer device 36 and heat sink 34 may be rotated to cause the threaded member 38 to thread through the plate 30 and to engage the die 24.

The heat transfer device 35 may be easily and accurately secured onto the integrated circuit 22 without the use of tools in some embodiments. Through a simple pivot, translate and rotate motion, the necessary connections may be securely and advantageously made.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   pivoting a heat transfer device mount over an integrated circuit;
   translating said mount relative to said integrated circuit; and
   securing a heat transfer device to said mount in contact with said integrated circuit.

2. The method of claim 1 wherein pivoting said mount includes pivoting said mount with said heat transfer device attached to said mount.

3. The method of claim 1 including rotating said heat transfer device relative to said mount to cause a portion of said heat transfer device to extend through said mount.

4. The method of claim 3 including causing said mount to push against said integrated circuit.

5. The method of claim 4 including causing said portion to press upwardly on said mount.

6. The method of claim 1 wherein translating said mount includes causing a latch on said mount to engage a catch on a holder for said integrated circuit.

7. The method of claim 6 wherein pivoting the mount includes pivoting the latch on said mount into a catch on said holder.

8. The method of claim 7 wherein translating said mount includes causing said latch to move inwardly into said catch.

9. The method of claim 8 including rotating said heat transfer device relative to said mount to cause said latch to engage said catch.

10. The method of claim 9 wherein rotating said mount includes pivoting said mount about an axle.

11. The method of claim 10 wherein translating said mount includes causing said mount to move relative to said axle.

12. A heat transfer device comprising:

a holder to receive an integrated circuit;

a mount coupled to said holder for relative pivotal motion; and a latching mechanism that couples said mount to said holder when said mount is translated relative and substantially parallel to said holder.

13. The device of claim 12 wherein said latching mechanism includes a latch on said mount and a catch on said holder such that said latch pivots to a position adjacent said catch.

14. The device of claim 13 wherein said mount is translatable relative to said holder to cause said latch to engage said catch.

15. The device of claim 14 including an axle allowing said mount to pivot relative to said holder, wherein said mount is coupled to said holder for pivotal movement around said axle such that translation is allowed between said mount and said holder.

16. The device of claim 15 wherein said axle is retained within an elliptical journal to allow relative movement between said mount and said holder.

17. The device of claim 12 including a heat transfer device secured to said mount.

18. The device of claim 17 including a heat sink threadedly coupled to said mount.

19. The device of claim 18 including an active heat transfer device.

20. The device of claim 18 wherein said heat sink may be rotated to thread a portion of said heat sink through said mount.

21. The device of claim 20 including an integrated circuit held by said holder, wherein said portion engages the integrated circuit held by said holder.

22. The device of claim 21 wherein when said mount is secured to said holder, and said portion provides an upward force applied to said mount when said portion engages said integrated circuit.

23. A motherboard comprising:

a circuit board;

a socket coupled to said circuit board;

a holder coupled to said circuit board around said socket;

a processor secured in said socket;

a mount coupled to said holder for relative pivotal motion; and a latching mechanism that couples said mount to said holder when said mount is translated relative and substantially parallel to said holder.

24. The motherboard of claim 23 wherein said latching mechanism includes a latch on said mount and a catch on said holder such that said latch pivots to a position adjacent said catch.

25. The motherboard of claim 24 wherein said mount is translatable relative to said holder to cause said latch to engage said catch.

26. The motherboard of claim 25 including an axle to allow said mount to pivot relative to said holder, wherein said mount is coupled to said holder for pivotal movement around said axle such that translation is allowed between said mount and said holder.

27. The motherboard of claim 26 wherein said axle is retained within an elliptical journal to allow relative movement between said mount and said holder.

28. The motherboard of claim 23 including a heat transfer device secured to said mount.

29. The motherboard of claim 28 including a heat sink threadedly coupled to said mount.

30. The motherboard of claim 29 including an active heat transfer device coupled to said heat sink.

* * * * *

UNITED STATES PATENT AND TRADEMARK OFFICE
CERTIFICATE OF CORRECTION

PATENT NO. : 6,236,569 B1
DATED : May 22, 2001
INVENTOR(S) : Shawn S. McEuen

It is certified that error appears in the above-identified patent and that said Letters Patent is hereby corrected as shown below:

Column 4,
Line 51, after "relative", insert -- and substantially parallel --.

Signed and Sealed this

Thirteenth Day of November, 2001

Attest:

*Nicholas P. Godici*

NICHOLAS P. GODICI
*Attesting Officer*  *Acting Director of the United States Patent and Trademark Office*